United States Patent
Shimada

(10) Patent No.: US 9,359,189 B2
(45) Date of Patent: Jun. 7, 2016

(54) MICRO ELECTRO MECHANICAL DEVICE, METHOD FOR MANUFACTURING THE SAME, SEMICONDUCTOR DEVICE, AND METHOD FOR MANUFACTURING THE SAME

(75) Inventor: Hiroyuki Shimada, Chuo (JP)

(73) Assignee: SEIKO EPSON CORPORATION, Tokyo (JP)

( * ) Notice: Subject to any disclaimer, the term of this patent is extended or adjusted under 35 U.S.C. 154(b) by 1071 days.

(21) Appl. No.: 12/264,595

(22) Filed: Nov. 4, 2008

(65) Prior Publication Data
US 2009/0127590 A1   May 21, 2009

(30) Foreign Application Priority Data

Nov. 16, 2007 (JP) ................. 2007-298009

(51) Int. Cl.
*H01L 29/84* (2006.01)
*B81B 3/00* (2006.01)
*G01P 15/12* (2006.01)

(52) U.S. Cl.
CPC .............. *B81B 3/0086* (2013.01); *G01P 15/124* (2013.01); *B81B 2201/0235* (2013.01); *B81B 2201/0264* (2013.01)

(58) Field of Classification Search
CPC ...................... B81B 3/0086; B81B 2201/0264; B81B 2201/0235; G01P 15/124
USPC .......... 257/252, 253, 254, 418, 419, E27.006, 257/E29.167, E29.324
See application file for complete search history.

(56) References Cited

U.S. PATENT DOCUMENTS

| 3,440,873 A * | 4/1969 | Eichelberger ............... 73/862.68 |
| 4,873,871 A | 10/1989 | Bai et al. |
| 4,894,698 A * | 1/1990 | Hijikigawa ........... G01L 9/0098 257/254 |
| 5,155,061 A | 10/1992 | O'Connor et al. |
| 5,576,251 A | 11/1996 | Garabedian et al. |
| 6,131,466 A | 10/2000 | Vigna et al. |
| 6,388,299 B1 | 5/2002 | Kang et al. |
| 6,417,021 B1 | 7/2002 | Vigna et al. |

(Continued)

FOREIGN PATENT DOCUMENTS

| EP | 2 023 460 A2 | 2/2009 |
| GB | 2 174 839 A | 11/1986 |

(Continued)

OTHER PUBLICATIONS

Buschnakowski et al.; "Development and Characterisation of a High Aspect Ratio Vertical FET Sensor for Motion Detection;" The 12th International Conference on Solid State Sensors. Actuators and Microsystems; Jun. 8-12, 2003; Boston; pp. 1391-1394.
European Search Report dated Nov. 2, 2010 for European Application No. EP 08 01 9916.

Primary Examiner — Vongsavanh Sengdara
(74) Attorney, Agent, or Firm — Oliff PLC

(57) ABSTRACT

A micro electro mechanical device includes: a semiconductor layer; a source/drain region formed on both sides of a channel region within the semiconductor layer; a gate insulating film formed on the semiconductor layer; a cavity formed on the gate insulating film; and a gate electrode formed on the cavity, the gate electrode being movable so as to contact with the gate insulating film. In the device, a pressure applied on the gate electrode is detected by a contact area of the gate electrode and the gate insulating film.

15 Claims, 9 Drawing Sheets

(56) References Cited

U.S. PATENT DOCUMENTS

| | | | |
|---|---|---|---|
| 7,246,526 B2 | 7/2007 | Won et al. | |
| 2002/0109161 A1* | 8/2002 | Chou | G01N 27/414 257/253 |
| 2003/0045040 A1* | 3/2003 | Frey | G01P 15/0802 438/200 |
| 2003/0127670 A1* | 7/2003 | Kang | G01P 15/0802 257/254 |
| 2004/0164371 A1* | 8/2004 | Kang | H01H 1/0036 257/467 |
| 2005/0155433 A1* | 7/2005 | Won | G01L 27/002 73/754 |
| 2005/0227428 A1 | 10/2005 | Mihai et al. | |
| 2005/0287717 A1* | 12/2005 | Heald et al. | 438/128 |
| 2006/0091484 A1* | 5/2006 | Kang | 257/415 |
| 2006/0245034 A1* | 11/2006 | Chen | G02B 26/001 359/291 |
| 2007/0034946 A1* | 2/2007 | Akamine et al. | 257/341 |
| 2007/0298534 A1* | 12/2007 | Ikushima | H01L 37/00 438/57 |
| 2009/0039832 A1* | 2/2009 | Cobianu | H02J 7/0031 320/134 |
| 2009/0194828 A1* | 8/2009 | Cobianu | B81C 1/00333 257/415 |

FOREIGN PATENT DOCUMENTS

| | | |
|---|---|---|
| JP | A-55-27948 | 2/1980 |
| JP | A-61-222178 | 10/1986 |
| JP | A-63-168527 | 7/1988 |
| JP | A-10-135487 | 5/1998 |
| JP | A-2000-214007 | 8/2000 |
| JP | A-2001-50702 | 2/2001 |
| JP | A-2005-233939 | 9/2005 |
| JP | A-2006-126182 | 5/2006 |
| JP | A-2007-71846 | 3/2007 |

* cited by examiner

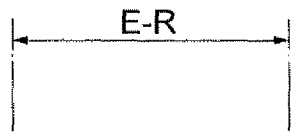

MICRO ELECTRO MECHANICAL DEVICE, METHOD FOR MANUFACTURING THE SAME, SEMICONDUCTOR DEVICE, AND METHOD FOR MANUFACTURING THE SAME

The entire disclosure of Japanese Patent Application No.: 2007-298009, filed Nov. 16, 2007 is expressly incorporated by the reference herein.

BACKGROUND

1. Technical Field

Several aspects of the present invention relate to a micro electro mechanical device, a method for manufacturing the same, a semiconductor device, and a method for manufacturing the same.

2. Related Art

Development and application of a sensor using a micro electro mechanical system (MEMS) composed of minute components to which a fine processing technique is applied has drawn increasing attention.

A pressure sensor and an acceleration sensor are examples of the above mentioned sensor. A technique detecting pressure or the like by the change of the electrostatic capacitance between two electrodes are used in a first example of related art. JP-A-2006-126182 is the first example of related art.

A sensor using a field effect transistor (EFT) has been under development as described in a second example and a third example of related art. JP-A-2007-71846 is the second example of related art, while S. Buschnakowski, et. al., "Development and Characterization of a High Aspect Ratio Vertical FET Sensor for Motion Detection", Transducers 2003, pp. 1391-1394 (2003) is the third example of related.

The inventor examines further the miniaturization and the performance improvement of sensors to which MEMS technique is applied.

However, the above mentioned sensor using the change of the electrostatic capacitance has a problem in that sensitivity is decreased due to the parasitic capacitance of wiring lines coupled to the sensor or the area of the electrode (for example, 300 μm to 500 μm square) is increased for enhancing the sensitivity.

On the contrary, downsizing and sensitivity enhancement can be achieved when the FET is used due to a signal amplification function of the FET.

However, the second and the third examples of related art have problems in that the steric structure is complicated and the manufacturing process is long and complicated.

SUMMARY

An advantage of the invention is the characteristic improvement of the micro electro mechanical device and the simplifying of the manufacturing process. Another advantage of the invention is to improve a semiconductor device in which a semiconductor element and a micro electro mechanical device are mixedly mounted and to simplify the manufacturing process.

According to a first aspect of the invention, a micro electro mechanical device includes: a semiconductor layer; a source/drain region formed on both sides of a channel region within the semiconductor layer; a gate insulating film formed on the semiconductor layer; a cavity formed on the gate insulating film; and a gate electrode that is formed on the cavity and is movable so as to contact with the gate insulating film. In the device, a pressure applied on the gate electrode is detected by a contact area of the gate electrode and the gate insulating film.

With this structure, the pressure applied on the gate electrode can be detected by the contact area of the gate electrode and the gate insulating film. The device can be simplified by using a temporary FET structure.

The pressure applied on the gate electrode may be detected by a current flowing in the channel region that overlaps with the contact area. The pressure applied on the gate electrode can be accurately detected by using the changes of the current flowing in the channel region depending on the contact area.

The source-drain region may have a pair of comb-teeth shapes in which the teeth are interdigitally arranged. With this structure, the channel region can be effectively laid out, and the detection accuracy can be improved.

A first insulating film that surrounds the cavity may be above the semiconductor layer. According to such a structure, the cavity is defined by the first insulating film, and a height of the cavity that equals to a film thickness of the first insulating film is kept.

The gate electrode may include a through-hole reaching the cavity. As above, the through-hole may be included in the gate electrode.

The gate electrode may include a protective film which is made of a second insulating film. According to such a structure, the cavity can be sealed, and also deterioration of the gate electrode can be reduced.

The gate electrode may be composed of one of polysilicon, high melting point metal, a composite film, and a compound film. The composite film and the compound film include one of polysilicon and the high melting point metal. Polysilicon or the high melting point metal may be used as the gate electrode.

According to a second aspect of the invention, a semiconductor device includes: a micro electro mechanical device including a semiconductor layer, a source/drain region formed on both sides of a channel region within the semiconductor layer, a gate insulating film formed on the semiconductor layer, a cavity formed on the gate insulating film, and a gate electrode that is formed on the cavity and is movable so as to contact with the gate insulating film; and a semiconductor element formed on a second region of the semiconductor layer. In the device, a pressure applied on the gate electrode is detected by a contact area of the gate electrode and the gate insulating film.

By setting the micro electro mechanical sensor as the FET structure including the cavity between the gate electrode and the gate insulating film, the semiconductor element can be easily mounted on a same semiconductor layer. Thus, the miniaturization and performance improvement of the semiconductor device can be realized.

The semiconductor element may be a metal insulator semiconductor field effect transistor (MISFET), and a gate electrode of the MISFET and the gate electrode of the micro electro mechanical sensor may be composed of a same material. The structure of the device can be simplified by sharing the structural portion of the semiconductor element of the MISFET or the like and the structural components of the micro electro mechanical sensor, making it easy to manufacture the device.

According to a third aspect of the invention, a method for manufacturing a micro electro mechanical device includes: preparing a substrate having a semiconductor layer; forming a source/drain region by implanting an impurity into a predetermined region of the semiconductor layer; forming a first insulating film on the semiconductor layer; forming a conductive film on the first insulating film; forming a through-hole reaching the first insulating film at the conductive film; forming a cavity that exposes the semiconductor layer under the conductive film by etching the first insulating film through the through-hole; and forming a second insulating film on a surface of the exposed semiconductor layer by a heat treatment.

With this method, a micro electro mechanical device can be easily formed that can detect the pressure of the gate electrode from a contact area of the gate electrode and the gate insulating film. Specifically, the thickness of the first insulating film becomes the height of the cavity, and the volume of the cavity can be easily controlled. The cavity can be easily formed by etching through a through-hole of the gate electrode. The second insulating film can be easily formed by thermally oxidizing the semiconductor layer exposed at the bottom of the cavity.

The source-drain region may have a pair of comb-teeth shapes in which the teeth are interdigitally arranged. According to the method, the channel region can be effectively laid out, and the detection accuracy can be improved.

According to a fourth aspect of the invention, a method for manufacturing a semiconductor device includes preparing a substrate having a semiconductor layer; forming a micro electro mechanical sensor in a first region of the semiconductor layer, the forming step including forming a source-drain region by implanting an impurity into a predetermined region of the first region, forming a first insulating film on the semiconductor layer, forming a conductive film on the first insulating film, forming a through-hole reaching to the first insulating film on the conductive film, forming a cavity that exposes the semiconductor layer under the conductive film by etching the first insulating film through the through-hole, and forming a second insulating film on a surface of the exposed semiconductor layer by heat treatment; and forming a semiconductor element in a second region of the semiconductor layer.

According to the method, a semiconductor device in which a micro electro mechanical sensor and a semiconductor element are mixedly mounded can be provided. The manufacturing process can be simplified since the structural portion of the semiconductor element and the micro electro mechanical sensor can be formed by a same process.

The semiconductor element may be a MISFET, and the method further includes forming the conductive film on the first and the second regions, and patterning the conductive film of the second region so as to form a gate electrode of the MISFET. The gate electrode of the micro electro mechanical sensor and the gate electrode of the MISFET may be formed by forming the conductive film on the first and the second regions.

BRIEF DESCRIPTION OF THE DRAWINGS

The invention will be described with reference to the accompanying drawings, wherein like numbers reference like elements.

FIG. 2B is a plan view, and these views show a method for manufacturing the MEMS sensor of the embodiment.

DESCRIPTION OF EXEMPLARY EMBODIMENTS

Figure 1A:
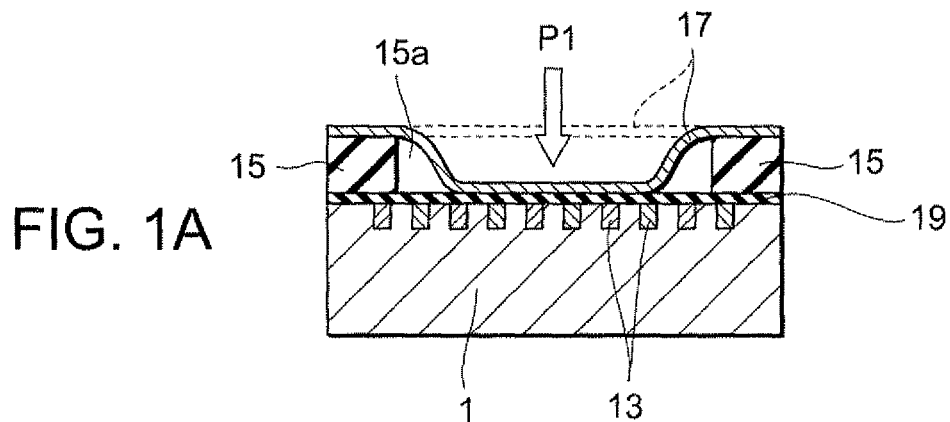
FIG. 1A and FIG. 1C are sectional views.

Embodiments of the invention will now be described in detail with references to the accompanying drawings. Like reference numerals denote like functional elements, and a detailed description thereof will be omitted.

Structure of a Micro Electro Mechanical System (MEMS) Sensor

Figure 1B:
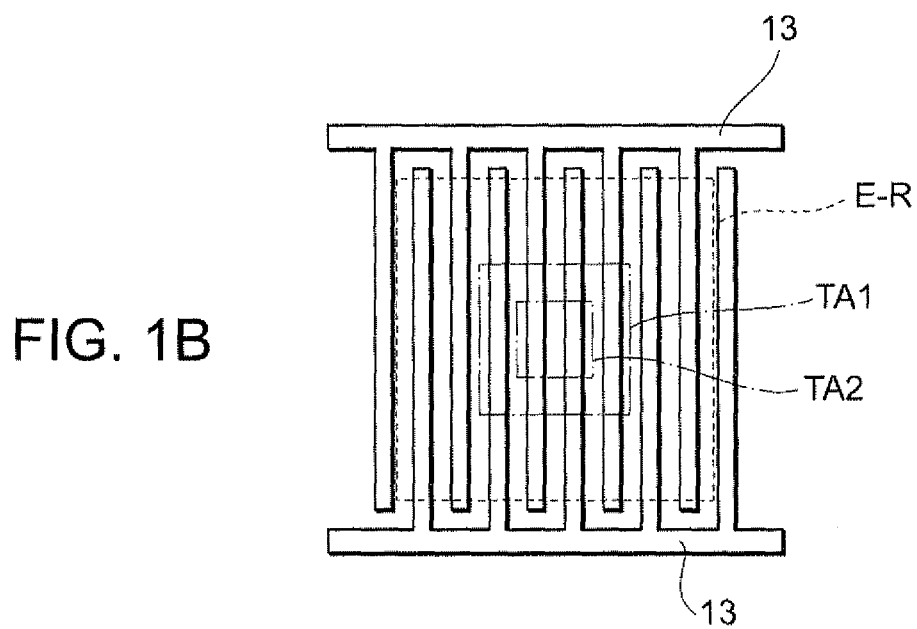
FIG. 1B is a plan view, and these views show a structure of a MEMS sensor (pressure sensor, micro electro mechanical device) according to an embodiment of the invention.
Figure 1C:
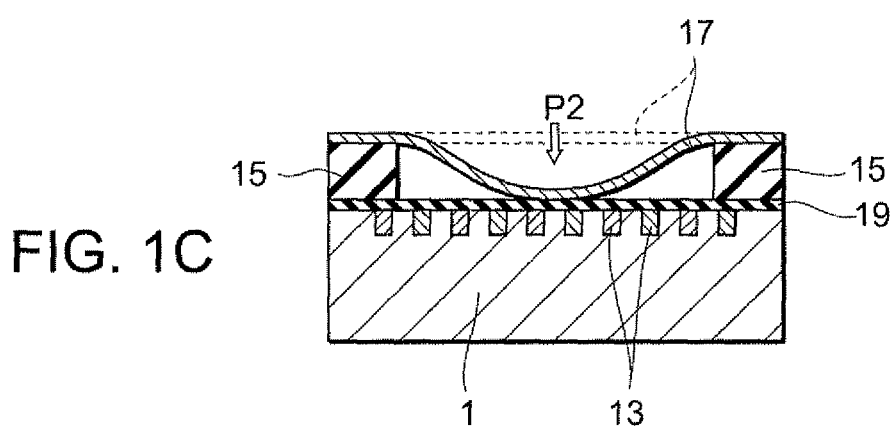

FIG. 1A and FIG. 1C are sectional views, and FIG. 1B is a plan view, and these views schematically show a structure of a MEMS sensor (pressure sensor, micro electro mechanical device) according to an embodiment of the invention.

As shown in FIG. 1A, the MEMS sensor of the present embodiment includes a gate electrode (gate electrode plate, diaphragm) 17, a gate insulating film 19, and a source electrode and a drain electrode in a source/drain region 13. A cavity (space, concave portion, movable space for gate electrode) 15a is disposed between the gate insulating film 19 and the gate electrode 17. The cavity 16a is surrounded by an insulating film 15. As will be described, the gate insulating film 19 may be disposed only under the cavity 15a.

When a pressure P1 is applied on the gate electrode 17, the gate electrode 17 is deformed, and contacts with the gate insulating film 19. A contact area TA1 is shown in FIG. 1B, for example. In this contact, a current (drain current) flows between the source and drain electrodes (channel region) in the source/drain region 13, and the pressure applied to the gate electrode 17 is detected by using the current.

As shown in FIG. 1C, when a pressure P2 applied on the gate electrode 17 is lower (the pressure P2 is smaller than the P1), a contact area TA2 of the gate electrode 17 and the gate insulating film 19 becomes smaller than the contact area TA1 (refer to FIG. 1B), and the amount of the current flow between the source electrode and the drain electrode becomes smaller.

According to the embodiment as above described, the pressure applied on the gate electrode 17 can be measured by the contact area of the gate electrode 17 and the gate insulating film 19. More specifically, the pressure applied on the gate electrode 17 can be detected by current flowing in a channel region that overlaps with the contact area. Meanwhile, a transistor that has a variable channel region where current flows can be said an area variable type transistor.

Manufacturing Method for a MEMS Sensor

Next, a method for manufacturing the MEMS sensor will be explained with reference to FIGS. 3 through 9. FIGS. 2 through 9 are sectional views and plan views that show a method for manufacturing the MEMS sensor. Each sectional view corresponds to a cross-section taken along line A-A of the plan views.

Figure 2A:
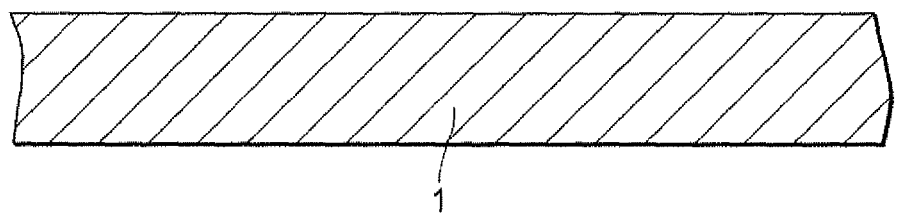
FIG. 2A and FIG. 2B are sectional views.

As shown in FIG. 2A, a semiconductor substrate 1 (e.g. silicon substrate) is prepared. In stead of using a semiconductor substrate 1, a glass substrate on which a semiconductor film is formed or a silicon on insulator (SOI) substrate may be used. Any substrate having a semiconductor film on its surface can be used.

A mask film which is thermally oxidized (not shown) is formed on an element region (element forming region, sensor area) E-R on the semiconductor substrate 1. For example, a silicon nitride film is deposited by a chemical vapor deposition (CVD) method and is patterned to have an almost rectangular shape having a size of 10 µm to 50 µm square. That is, a photoresist film is formed on the nitride silicon film, and the photoresist film having an almost rectangular shape is formed by performing exposure and development (photolithography). Next, the silicon nitride film is etched by using the photoresist film as a mask. Then, the remaining photoresist film 11 is removed. The series of steps from forming to removing the photoresist film is called patterning.

Figure 2B:
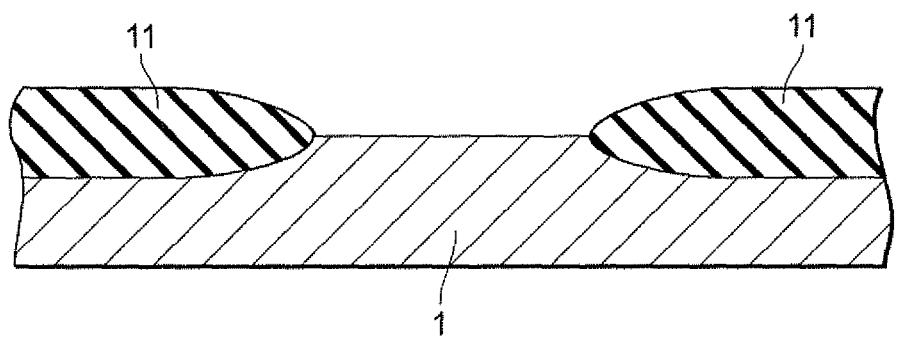
Figure 2C:
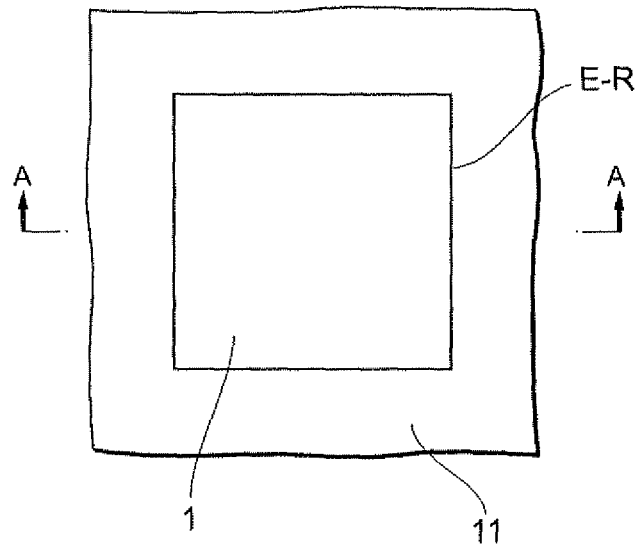
FIG. 2C is a plan view, and these views show a method for manufacturing the MEMS sensor of the embodiment.

Next, the semiconductor substrate 1 is thermally oxidized to form, for example, a local oxidation of silicon (LOCOS) film to 300 nm as an element region 11 by using the silicon nitride film as a mask (FIG. 2B). Thereafter, the silicon nitride film is removed by etching to expose the surface of the semiconductor substrate 1 of the element region E-R (FIG. 2C). A trench isolation film formed by using a shallow trench isolation (STI) technology can be used as the element isolation film 11 instead.

Figure 3A:
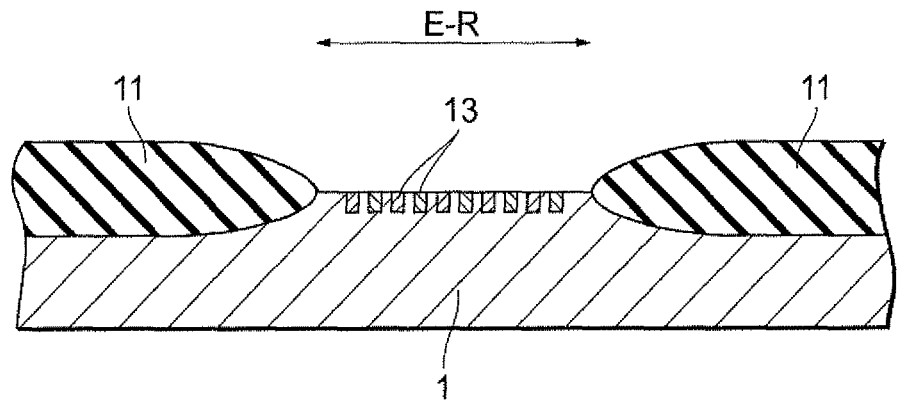
FIG. 3A is a sectional view.

As shown in FIG. 3A, the source/drain region 13 is formed within the element region E-R of the semiconductor substrate 1. A photoresist film is formed as a predetermined shape (a zigzag non-hatched shape within the element region E-R of FIG. 3B), and an impurity (phosphorus or boron) is implanted into the semiconductor substrate 1 by using the film as a mask. Next, the photoresist film is removed. Then, the semiconductor substrate 1 is annealed (heat treatment) to diffuse the impurity, and activated.

Figure 3B:
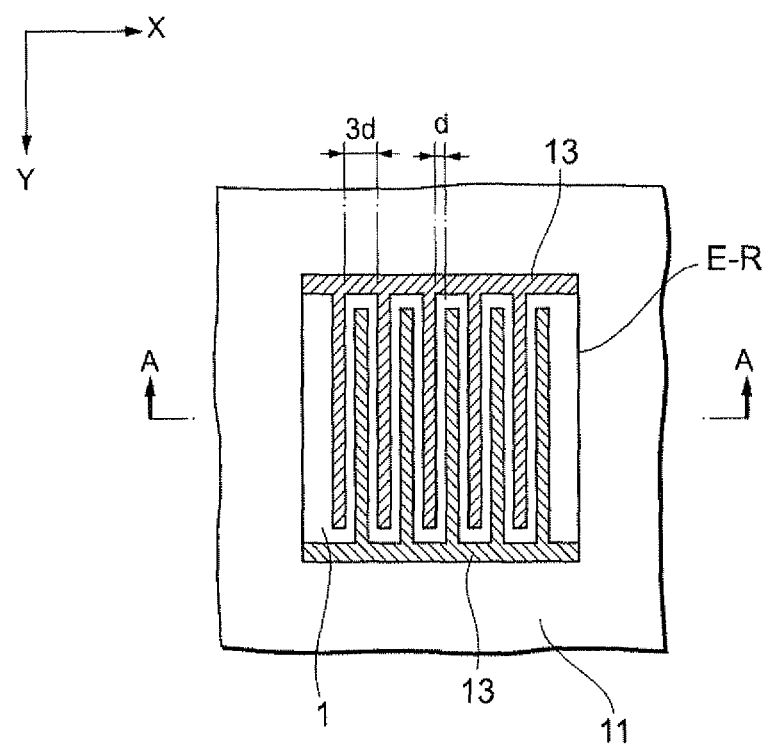

As shown in FIG. 3B, the source/drain region 13 has a pair of comb-teeth shapes. That is, the source/drain region 13 includes a main line extending in the X-direction and a plurality of sub-lines that extends in the Y-direction from the main line and is disposed at an interval 3d. The sub-lines are interdigitated at an interval "d". The intervals of the sub-lines are approximately 0.5 µm, for example. The intervals become the main channel region. The shape of the source/drain region 13 is not limited to the comb-teeth shape, but various modifications are possible. However, according to the above comb-teeth shapes, the channel region can be laid out the whole surface of the element region E-R, and an amplification factor of FET can be increased (refer to the non-hatched part within E-R of FIG. 3B, for example).

Figure 4:
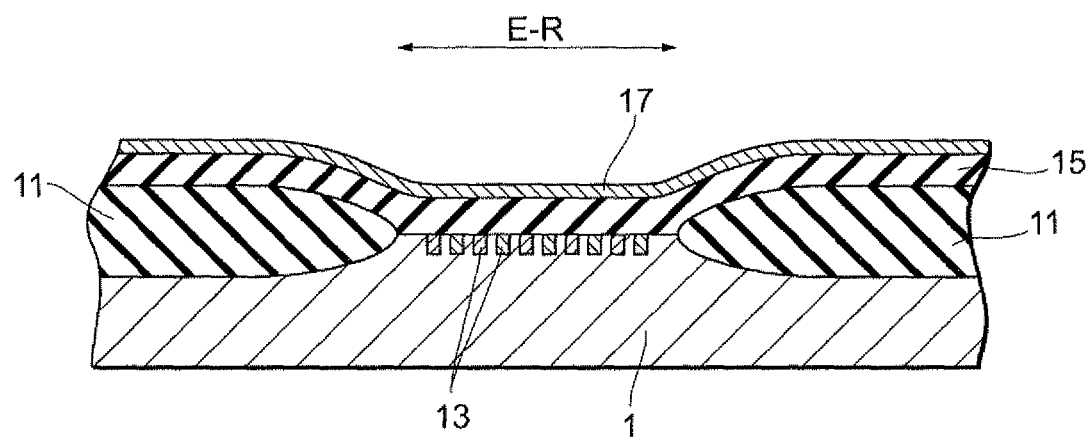
FIG. 4 is a sectional view showing a method for manufacturing the MEMS sensor of the embodiment.

As shown in FIG. 4, a silicon oxide film, for example, is deposited to about 100 nm by a CVD method as an interlayer insulation film (sacrifice layer) 15 on both the element region E-R and the element isolation film 11. As will be described, a thickness of the insulating film 15 is the height of the cavity 15a. Therefore, characteristics of the sensor can be adjusted easily by suitably adjusting the thickness of the insulating film in consideration of the physical properties (Young's modulus), size, and the film thickness of the gate electrode 17.

Then, a polysilicon film doped with impurity, such as phosphorus, is deposited to about 200 nm by a CVD method on the insulating film 15 as a conductive film 17. This conductive film 17 serves as a gate electrode. Instead of using the polysilicon film, a high melting point metal, such as tungsten, tantalum, molybdenum, an electrode material, such as titanium, cobalt, and nickel, a composite film or a compound film (a silicide film, for example) of them can be used.

Figure 5A:
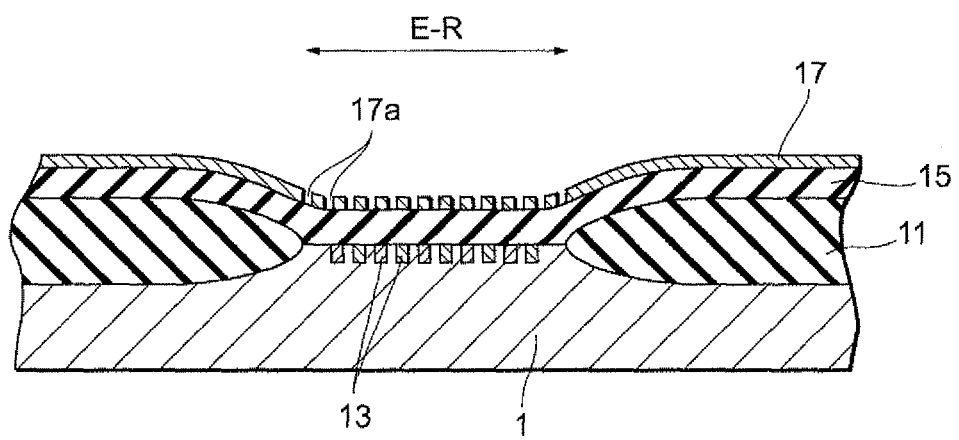
FIG. 5A is a sectional view.
Figure 5B:
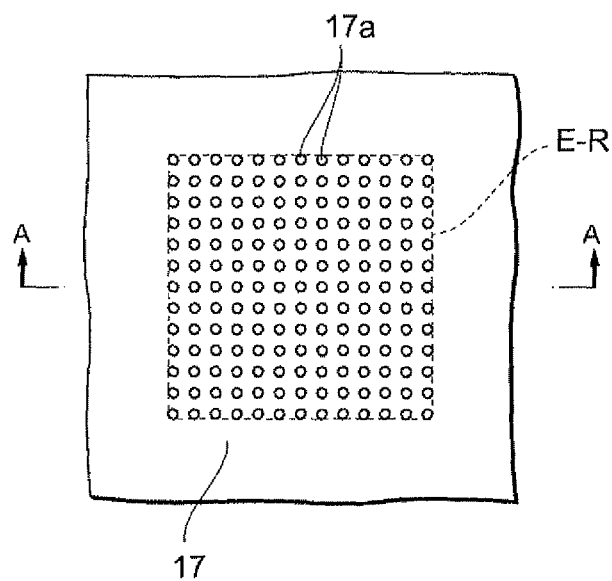
FIG. 5B is a plan view, and these views show a method for manufacturing the MEMS sensor of the embodiment.

As shown in FIG. 5A, through-holes (hole) 17a which expose the insulating film 15 disposed under the conductive film 17 are formed by patterning the conductive film 17 of the element region E-R. That is, the conductive film 17 is etched until the insulating film 15 is exposed by using the photoresist film which has a plurality of holes as a mask. The etching is performed by a hydrofluoric acid or a hydrofluoric acid vapor, for example. Here, as shown in FIG. 5B, the through-holes 17a are formed in an array at regular intervals.

Figure 6:
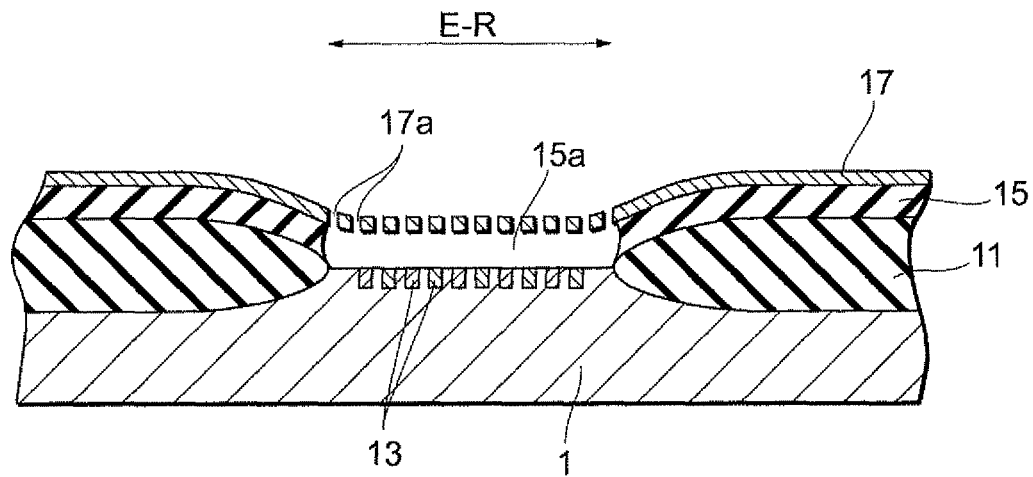
FIG. 6 is a sectional view showing a method for manufacturing the MEMS sensor of the embodiment.

As shown in FIG. 6, the cavity 15a is formed under the conductive film 17 by etching the insulating film 15 through the throughholes 17a until the semiconductor substrate (the source/drain region 13) which is the underlayer of the insulating film 15 is exposed. The insulating film 15 remains around the cavity 15a. In other words, the cavity 15a is surrounded (partitioned) by the insulating film 15. In addition, the volume (capacity) of the cavity 15a can be controlled by the thickness of the insulating film 15, and the number of and the formed positions of throughholes 17a. The through-holes 17a can reduce the internal stress caused by the deformation of the gate electrode 17.

Figure 7:
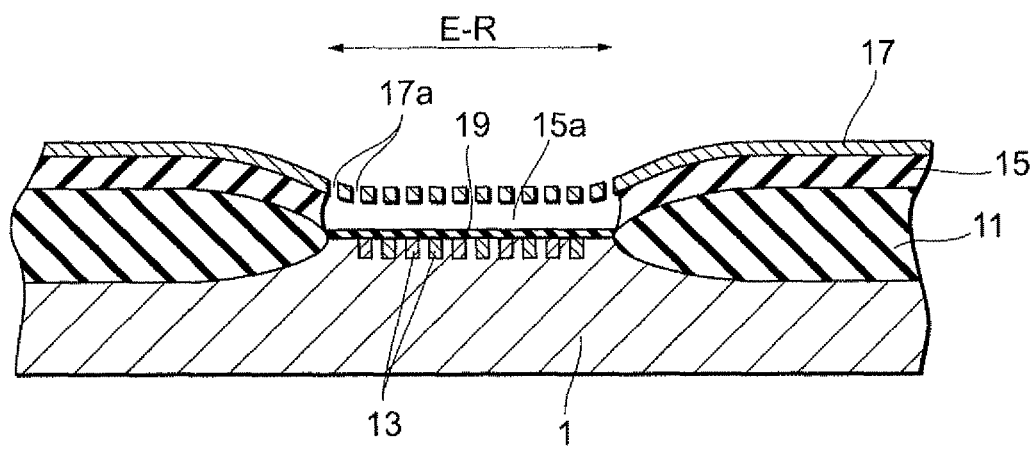
FIG. 7 is a sectional view showing a method for manufacturing the MEMS sensor of the embodiment.

As shown in FIG. 7, by heat-treating the semiconductor substrate 1 under an oxidizing atmosphere, a thermally oxidized film (in this case, silicon oxide film) 19 is formed on the surface of the semiconductor substrate 1 which is exposed from the bottom of the cavity 15. This thermally oxidized film (silicon oxide film) 19 serves as a gate insulating film. Although it is not illustrated, a back surface of the conductive film 17 (a surface at a side adjacent to the cavity 15a) is also slightly thermally oxidized. As the thermally oxidized film, a silicon oxynitride film can be alternatively used instead of the silicon oxide film. In this case, heat treatment is carried out under a nitric oxide (NO, N$_2$O) atmosphere.

Figure 8:
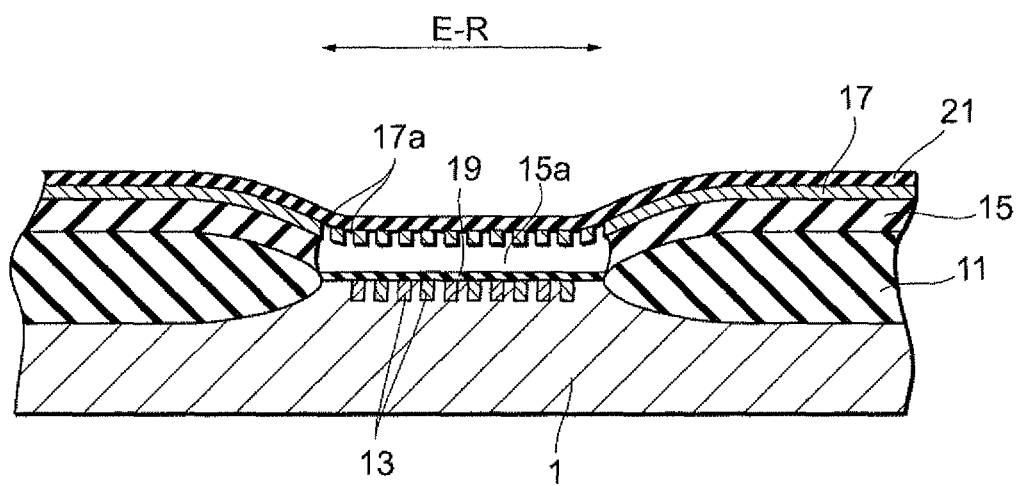
FIG. 8 is a sectional view showing a method for manufacturing the MEMS sensor of the embodiment.

As shown in FIG. 8, the cavity 15a is vacuum sealed with a protective film 21, which is, e.g., a silicon nitride film formed under reduced pressure, formed on the conductive film 17. The silicon oxynitride film is formed to about 200 nm by a high density plasma (HDP), or a CVD method, for example. In this case, a film formation method in which an isotropic deposition dominates the process is preferably used. When the film is isotropically formed, the film is formed in an eave shape at an upper corner of each of the through-holes 17a of the conductive film 17, and upper parts of the through-holes 17a are covered in the early stage. Thus, the protective film 21 hardly enters the cavity 15a through the through-holes 17a. As a result, the FET characteristics can be readily controlled.

Instead of a silicon nitride film, an insulating film, such as a silicon oxide film, can be used as the protective film 21. The cavity 15a can be sealed and deterioration (oxidization) of the conductive film 17 can be reduced by forming the insulating film. The film stress is canceled out when the silicon nitride film and the polysilicon film are stacked. That is, the internal stress of stacked layers can be reduced since tensile force and compression force within each layer works in a reverse direction. Accordingly, the warpage and cracks of the film can be reduced. The protective film 21 and the conductive film (gate electrode) 17 which is a lower layer of the protective film 21 are patterned to a predetermined shape (for example, every sensor).

Figure 9A:
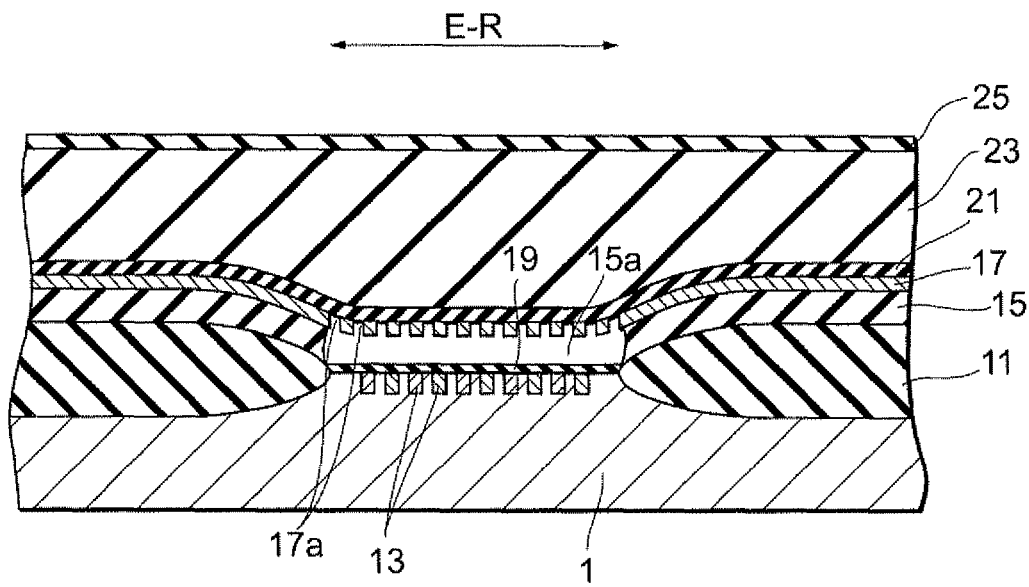
FIG. 9A and FIG. 9B are sectional views showing a method for manufacturing the MEMS sensor of the embodiment.

Referring to FIG. 9A, a silicon oxide film is formed as an interlayer insulation film 23 on the protective film 21, and a silicon nitride film is deposited as an uppermost protection film (passivation film) 25 on the upper part of the interlayer insulation film 23. Wiring lines connected to the source/drain region 13 and the gate electrode 17 can be appropriately formed within the interlayer insulation film 23. In this case, wiring lines are laid out by avoiding an opening 27.

Figure 9B:
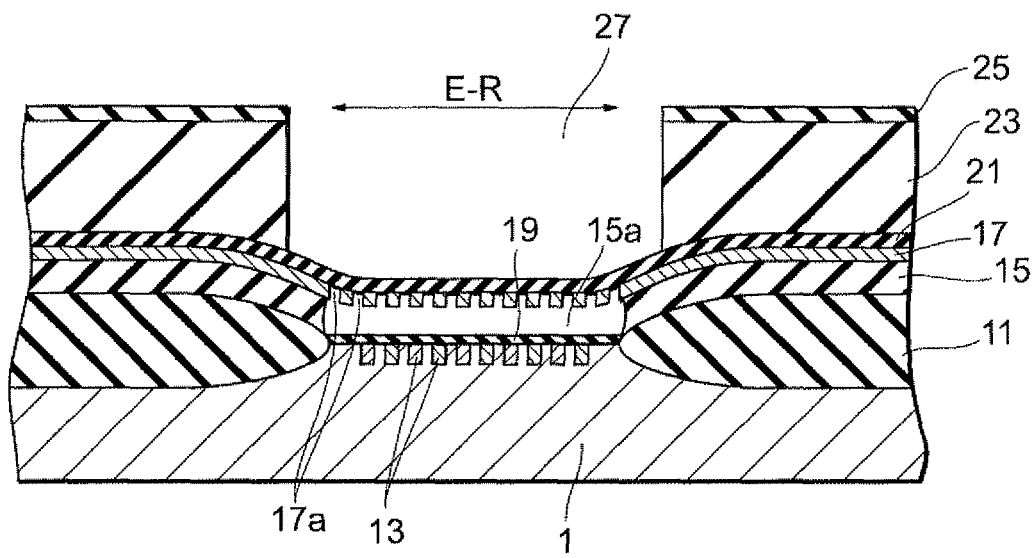

As shown in FIG. 9B, by patterning the interlayer insulation film 23 and the uppermost protection film 25, the opening (an opening to introduce outside pressure) 27 is formed on the element region E-R and the protective film 21 is exposed.

The MEMS sensor of the present embodiment is almost completed through the above processes.

According to the embodiment as above described, providing the cavity 15a between the gate electrode 17 and the gate insulating film 19 can temporarily form an FET structure by using the deformation of the gate electrode 17. Thus, the presence of the deformation of the gate electrode 17 and the degree of the deformation can be detected from the operation of the FET. That is, the pressure applied to the gate electrode 17 can be measured, and the structure can be functioned as a sensor.

Since the gate electrode 17 may touch the gate insulating film 19, it is possible to reduce the depth of the cavity. In addition, the most advanced microfabrication technology of the semiconductor field (complementary metal oxide semiconductor (CMOS) process, for example) can be used for the source/drain electrode 13, and further miniaturization, downsizing, and enhancement of sensitivity can be achieved.

In addition, since the MEMS sensor operates when the gate electrode 17 contacts with the gate insulating film 19, the mechanical reliability can be enhanced. The gate electrode 17 is protected and hard to be broken by contacting with the gate insulating film 19 even if a high pressure is applied, for example.

It is possible to adjust the detection range easily by changing the size of the element region E-R. If the element region E-R is small, for example, the gate electrode 17 makes contact with the gate insulating film 19 under a high pressure, and the device becomes a sensor for a high pressure. The range of detection can also be adjusted by changing the thickness of the gate electrode 17 and the height of the cavity 15a (the film thickness of the insulating film 15).

By utilizing the current amplification effect of the FET, the change of the current corresponding to the change of the pressure can be increased, and this makes it possible to reduce the size, and the sensitivity becomes favorable when compared to a conventional electrostatic capacitance sensor (300 µm to 500 µm square size, for example).

As described above, the structure and the manufacturing process can be simplified compared to a conventional FET sensor, and a simple structured and high performance device can be provided. Improving throughput also can be realized.

Figure 10:
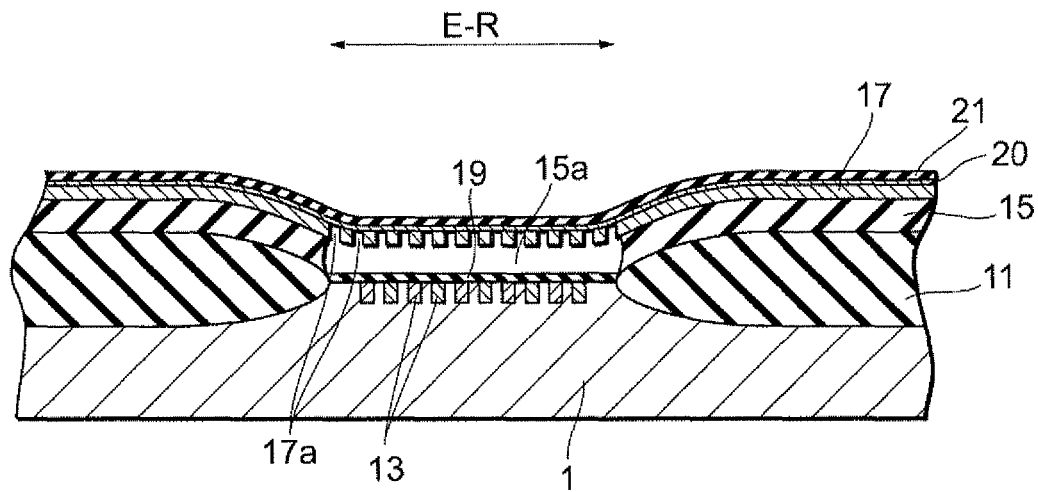
FIG. 10 is a sectional view showing a method for manufacturing the MEMS sensor of the embodiment.

In the above embodiment, although the silicon nitride film, for example, is formed on the conductive film 17 as the protective film 21 as shown in FIG. 8, the silicon nitride film, for example, can be formed as the protective film 21 on a metal film 20, such as tantalum or zirconium film, deposited by a sputtering method as shown in FIG. 10. FIG. 10 is a sectional view of another method for manufacturing the MEMS sensor of the embodiment.

A large quantity of the isotropically deposited component in sputtering the metal film 20 easily covers the through-holes 17a of the conductive film in the early stage. After sealing the cavity 15a into the reduced pressure condition, an impurity gas (oxygen, for example) remains inside of the cavity 15a and the metal film 20 are reacted, and that makes it possible to improve a degree of vacuum inside the cavity 15a.

The structure of the MEMS sensor showing in FIG. 10 is the structure as same as that of the sensor described above except for the metal film 20. The manufacturing method is also as same as that for the sensor described above other than the steps of forming the metal film mentioned above.

The MEMS sensor of the embodiment and a semiconductor element can be mixedly provided since the sensor has a quasi FET structure. In other words, the MEMS sensor and the semiconductor element can be formed on a same semiconductor chip. For example, the MEMS sensor is formed at a sensor forming region R1, and a semiconductor element, such as metal insulator semiconductor field effect transistor (MISFT), can be formed at a semiconductor element forming region R2. The MISFET can be used as a peripheral circuit (drive circuit) which activates a sensor, for example. The peripheral circuit has a circuit for compensating the temperature, for example.

Figure 11:
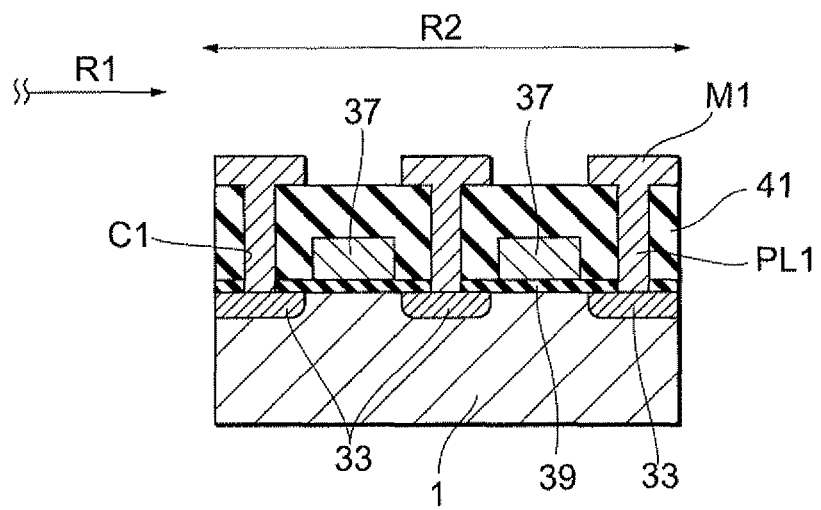
FIG. 11 is a sectional view showing an example of a MISFET.

An example of a MISFET is shown in FIG. 11. In FIG. 11, two transistors are disposed on the semiconductor substrate 1. The transistors are formed in following manner. A gate electrode 37 is formed on the semiconductor substrate 1 with a gate insulating film 39, and a source/drain region 33 is formed by implanting an impurity into both sides of the gate electrode 37. Next, an interlayer insulation film 41 is formed on the gate electrodes 37, and contact holes C1 are formed by etching the insulation films 41 on the source/drain region. First layer wiring lines M1 and connections PL1 are formed by depositing the conductive films on the interlayer insulation film 41 and inside the contact holes C1. Thereafter, multi-layered wiring lines may be formed on the first layer wiring lines M1 by repeating the steps of forming the interlayer insulation film and wiring lines. Furthermore, an uppermost protection film is formed at the uppermost layer. The interlayer insulation film and the uppermost protection film respectively correspond to the interlayer insulation film 12 and the uppermost protection film 25 shown in FIG. 8.

By forming the MISFT and the gate electrode of the micro electro mechanical sensor with a same material, for example, the structure of the device can be simplified, and that makes it easy to manufacture the device. By pattering phosphorus-doped polysilicon films formed on both the sensor forming region R1 and the MEMS sensor, the gate electrode 17 of the MEMS sensor and the gate electrodes 37 of the MISFET may be formed.

While the gate electrode 17 of the MEMS sensor and the gate electrodes 37 of the MISFET in the above-mentioned example are formed with a same material, the first layer wiring lines M1 of the MISFET and the gate electrode 17 of the MEMS sensor may be formed with a same material.

Thus, providing the semiconductor element and the MEMS sensor within a single chip enables the miniaturization and the performance of the semiconductor devices to be improved. Other than the above-mentioned peripheral circuit, providing various memories (DRAM, SRAM, EEPROM) and a microcomputer within a single chip also makes it possible to construct a system, and the device also can become more multifunctional.

The manufacturing processes can be simplified by sharing the structural portion of the MEMS sensor and the structural components of the semiconductor element.

The MEMS sensor (semiconductor device) can be used as a pressure sensor, such as an air pressure monitor for vehicle tires and a monitor for the intake and exhaust of an engine. Therefore, a miniaturized and high performance monitor can be provided. It is needless to say that the above-mentioned sensor is not limited to vehicles, but can be mounted on various devices.

The MEMS sensor also can be applied as a vibration sensor and an acceleration sensor other than the pressure sensor. Furthermore, the accuracy of the sensor can be improved, for example, by suitably adjusting the mass, the supporting points, and the shape of the gate electrode.

The invention is not limited to the descriptions of the above-referenced embodiments, and the examples and applications thereof described throughout the above-described embodiments may be optionally combined according to the application, and can be used with modification or refinement. It is apparent from the description of the claims that embodiments which add such a combination, changes, or improvement can be included in the technical scope of the invention.

What is claimed is:

1. A micro electro mechanical device, comprising:
a semiconductor layer;
a source region disposed at one side of a channel region of the semiconductor layer;
a drain region disposed at another side of the channel region of the semiconductor layer;
a first insulator disposed outside of the source region, the drain region, and the channel region;
a second insulator disposed on and in direct contact with the first insulator, material constituting the second insulator having different physical properties than that constituting the first insulator;
a gate insulating film disposed on the semiconductor layer at an opening of the first insulator;
a cavity disposed on the gate insulating film and formed by a gap in the second insulator; and
a gate electrode disposed on the cavity and the second insulator so that the second insulator is between the first insulator and the gate electrode, a portion of the gate electrode being movable so as to contact the gate insulating film, wherein:
the gap in the second insulator is between the portion of the gate electrode and the gate insulating film,
a pressure applied to the portion of the gate electrode causes the portion of the gate electrode to deform and contact the gate insulating film in a contact area, the pressure being detected by a current between the source region and the drain region,
the contact area increases as the pressure increases, and
the contact area decreases as the pressure decreases.

2. The micro electro mechanical device according to claim 1, wherein the pressure applied on the portion of the gate electrode is detected by current flowing in the channel region that overlaps with the contact area.

3. The micro electro mechanical device according to claim 1, wherein the source region and the drain region have a pair of comb-teeth shapes in which teeth are interdigitally arranged.

4. The micro electro mechanical device according to claim 3, wherein the source region and the drain region include a plurality of main lines extending in a first direction and a plurality of sub-lines extending from at least one of the plurality of main lines in a direction intersecting with the first direction, the plurality of sub-lines being interdigitally arranged.

5. The micro electro mechanical device according to claim 1, wherein the first insulator surrounds the cavity above the semiconductor layer.

6. The micro electro mechanical device according to claim 1, wherein the gate electrode includes a through-hole reaching the cavity.

7. The micro electro mechanical device according to claim 1, further comprising a protective film on the gate electrode, wherein the protective film is an insulating film.

8. The micro electro mechanical device according to claim 1, wherein the gate electrode is composed of one of (i) polysilicon, (ii) high melting point metal, (iii) a composite film, and (iv) a compound film, and the composite film and the compound film include one of polysilicon and the high melting point metal.

9. The micro electro mechanical device according to claim 1, wherein
the gate electrode is formed of a conductive material, and
the gate electrode includes a plurality of through-holes that reach the cavity and that are formed in an array at regular intervals.

10. The micro electro mechanical device according to claim 1, wherein the portion of the gate electrode contacts the gate insulating film through the gap in the second insulator.

11. The micro electro mechanical device according to claim 1, wherein the first insulator and the gate insulating film are in direct contact with the semiconductor layer.

12. A semiconductor device, comprising:
a micro electro mechanical device formed on a sensor forming region, the micro mechanical device including:
a semiconductor layer;
a source region disposed at one side of a channel region of the semiconductor layer;
a drain region disposed at another side of the channel region of the semiconductor layer;
a first insulator disposed outside of the source region, the drain region, and the channel region;
a second insulator disposed on and in direct contact with the first insulator, material containing the second insulator having different physical properties than that constituting the first insulator;
a gate insulating film disposed on the semiconductor layer at an opening of the first insulator;
a cavity disposed on the gate insulating film and formed by a gap in the second insulator; and
a gate electrode disposed on the cavity and the second insulator so that the second insulator is between the first insulator and the gate electrode, a portion of the gate electrode being movable so as to contact the gate insulating film, wherein:
the gap in the second insulator is between the portion of the gate electrode and the gate insulating film,
a pressure applied to the portion of the gate electrode causes the portion of the gate electrode to deform and contact the gate insulating film in a contact area, the pressure being detected by a current between the source region and the drain region,
the contact area increases as the pressure increases,
the contact area decreases as the pressure decreases, and
the semiconductor device further comprises a semiconductor element formed on a semiconductor forming region of the semiconductor layer.

13. The semiconductor device according to claim 12, wherein the semiconductor element is a metal insulator semiconductor field effect transistor (MISFET), and a gate electrode of the MISFET and a gate electrode of the micro electro mechanical device are composed of a same material.

14. The semiconductor device according to claim 12, wherein the portion of the gate electrode contacts the gate insulating film through the gap in the second insulator.

15. The semiconductor device according to claim 12, wherein the first insulator and the gate insulating film are in direct contact with the semiconductor layer.

* * * * *